(12) United States Patent
Jung et al.

(10) Patent No.: US 12,261,107 B2
(45) Date of Patent: Mar. 25, 2025

(54) SEMICONDUCTOR PACKAGE INCLUDING REDISTRIBUTION SUBSTRATE AND METHOD OF MANUFACTURING THE SAME

(71) Applicant: Samsung Electronics Co., Ltd., Suwon-si (KR)

(72) Inventors: Moongil Jung, Asan-si (KR); Suhyeon Ku, Asan-si (KR); Soyoen Park, Cheonan-si (KR); Kyungsub Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 17/693,867

(22) Filed: Mar. 14, 2022

(65) Prior Publication Data

US 2023/0005828 A1    Jan. 5, 2023

(30) Foreign Application Priority Data

Jul. 2, 2021    (KR) .................. 10-2021-0087326

(51) Int. Cl.
*H01L 23/498*    (2006.01)
*H01L 23/00*    (2006.01)
*H01L 23/31*    (2006.01)

(52) U.S. Cl.
CPC .... *H01L 23/49822* (2013.01); *H01L 23/3128* (2013.01); *H01L 23/49827* (2013.01);
(Continued)

(58) Field of Classification Search
CPC ........... H01L 23/49822; H01L 23/3128; H01L 23/49827; H01L 23/562; H01L 23/49816;
H01L 23/485; H01L 24/73; H01L 24/13; H01L 24/16; H01L 24/32; H01L 24/81; H01L 24/83; H01L 24/02; H01L 21/568;
(Continued)

(56) References Cited

U.S. PATENT DOCUMENTS 8,324,738 B2    12/2012    Liu et al.
9,553,060 B2    1/2017    Omori
(Continued)

FOREIGN PATENT DOCUMENTS

KR    10-2017-0105585 A    9/2017

*Primary Examiner* — Wasiul Haider
(74) *Attorney, Agent, or Firm* — Harness, Dickey & Pierce, P.L.C.

(57) ABSTRACT

A semiconductor package includes a semiconductor chip; and a redistribution substrate connected to the semiconductor chip, the redistribution structure including a conductive structure including a lower conductive pattern and a redistribution structure on the lower conductive pattern and electrically connected to the lower conductive pattern, an insulating structure covering at least a side surface of the lower conductive pattern or a side surface of the redistribution structure, and a protective layer between the insulating structure and at least one of the lower conductive pattern or the redistribution structure. The protective layer including a first protective layer in contact with at least one of a side surface of the lower conductive pattern or a side surface of the redistribution structure, and a second protective layer in contact with at least a portion of a side surface of the first protective layer.

19 Claims, 11 Drawing Sheets

(52) U.S. Cl.
CPC ............ *H01L 23/562* (2013.01); *H01L 24/73* (2013.01); *H01L 2224/73204* (2013.01)

(58) Field of Classification Search
CPC ....... H01L 21/6835; H01L 2924/15174; H01L 2924/15311; H01L 2924/181; H01L 2224/73204; H01L 2224/32225; H01L 2224/13101; H01L 2224/16225; H01L 2224/81001; H01L 2224/81815; H01L 2224/83001; H01L 2224/92125; H01L 2224/02165; H01L 2224/0218; H01L 2224/022; H01L 2224/0233; H01L 2224/024; H01L 2224/08057; H01L 2224/08058; H01L 2224/08059; H01L 2221/68345
See application file for complete search history.

(56) References Cited

U.S. PATENT DOCUMENTS

| | | | |
|---|---|---|---|
| 9,721,886 B2 | 8/2017 | Lee et al. | |
| 9,972,505 B2* | 5/2018 | Matsumoto | H01L 21/76885 |
| 10,083,924 B2 | 9/2018 | Maekawa et al. | |
| 10,332,792 B1 | 6/2019 | Gambee | |
| 2006/0017161 A1 | 1/2006 | Chung et al. | |
| 2016/0260695 A1 | 9/2016 | Chung et al. | |
| 2019/0027450 A1* | 1/2019 | Choi | H01L 24/03 |
| 2019/0035728 A1* | 1/2019 | Venegoni | H01L 23/5283 |
| 2019/0393150 A1* | 12/2019 | Liu | H01L 21/56 |
| 2020/0075496 A1* | 3/2020 | Yu | H01L 24/05 |
| 2021/0098382 A1* | 4/2021 | Lin | H01L 21/4857 |
| 2021/0287937 A1* | 9/2021 | Shih | H01L 21/7682 |
| 2021/0375791 A1* | 12/2021 | Oda | H01L 23/564 |
| 2022/0320039 A1* | 10/2022 | Kuo | H01L 25/03 |

\* cited by examiner

SEMICONDUCTOR PACKAGE INCLUDING REDISTRIBUTION SUBSTRATE AND METHOD OF MANUFACTURING THE SAME

CROSS-REFERENCE TO RELATED APPLICATION(S)

This application claims the benefit below 35 USC 119(a) of Korean Patent Application No. 10-2021-0087326 filed on Jul. 2, 2021 in the Korean Intellectual Property Office, the entire disclosure of which is incorporated herein by reference for all purposes.

BACKGROUND

The present inventive concepts relate to a semiconductor package including a redistribution substrate and a method of manufacturing the same.

In general, semiconductor packages may comprise a printed circuit board and a semiconductor chip mounted on the printed circuit board. This type of semiconductor package structure may have difficulty in reliably packaging semiconductor chips recently required to have expected multifunctionality and/or higher levels of performance.

SUMMARY

Example embodiments provide a reliable semiconductor package.

Example embodiments provide a method of manufacturing a semiconductor package.

According to example embodiments, a semiconductor package includes a semiconductor chip; and a redistribution substrate connected to the semiconductor chip, the redistribution structure including a conductive structure including a lower conductive pattern and a redistribution structure on the lower conductive pattern and electrically connected to the lower conductive pattern, an insulating structure covering at least a side surface of the lower conductive pattern or a side surface of the redistribution structure, and a protective layer between the insulating structure and at least one of the lower conductive pattern or the redistribution structure. The protective layer including a first protective layer in contact with at least one of a side surface of the lower conductive pattern or a side surface of the redistribution structure, and a second protective layer in contact with at least a portion of a side surface of the first protective layer.

According to example embodiments, a semiconductor package includes a redistribution substrate including a conductive structure and an insulating structure covering at least a side surface of the conductive structure, a semiconductor chip on a first surface of the redistribution substrate, and an upper connection pattern between the redistribution substrate and the semiconductor chip, the upper connection pattern electrically connecting the redistribution structure substrate and the semiconductor chip. The conductive structure includes a redistribution structure including a lower conductive pattern electrically connected to a lower connection pattern, and a plurality of redistribution patterns on different levels on the lower conductive pattern, the redistribution substrate further includes a protective layer between the insulating structure and at least one of the lower conductive pattern or the redistribution structure, the protective layer includes a first protective layer in contact with at least one of a side surface of the lower conductive pattern or a side surface of the redistribution structure, and a second protective layer in contact with at least a portion of a side surface of the first protective layer, a lower redistribution pattern among the plurality of redistribution patterns includes a redistribution line, and a via connecting a portion of the redistribution line with the lower conductive pattern.

According to example embodiments, a semiconductor package includes a redistribution substrate including a conductive structure including a lower conductive pattern and a redistribution structure on the lower conductive pattern and electrically connected to the lower conductive pattern, an insulating structure covering at least a side surface of the redistribution structure, and a protective layer between the insulating structure and at least one of the lower conductive pattern or the redistribution structure, the protective layer including a first protective layer and a second protective layer, the first protective layer covering at least one of a side surface of the lower conductive pattern or a side surface of the redistribution structure, and the second protective layer covering a side surface of the first protective layer, a semiconductor chip on the redistribution substrate, and a lower connection pattern below the redistribution substrate and in contact with the lower conductive pattern and the protective layer. A thickness of the first protective layer is in a range of 10 Å to 100 Å, and a thickness of the second protective layer is in a range of 100 Å to 1000 Å.

According to example embodiments, a method of manufacturing a semiconductor package includes forming a lower conductive pattern on a carrier, forming a first protective layer covering a side surface of the lower conductive pattern, forming a second protective layer covering a side surface of the first protective layer, forming a structure including an insulating structure and a redistribution structure, on the lower conductive pattern, the first protective layer, and the second protective layer, mounting a semiconductor chip on the structure, and exposing the lower conductive pattern by removing the carrier.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
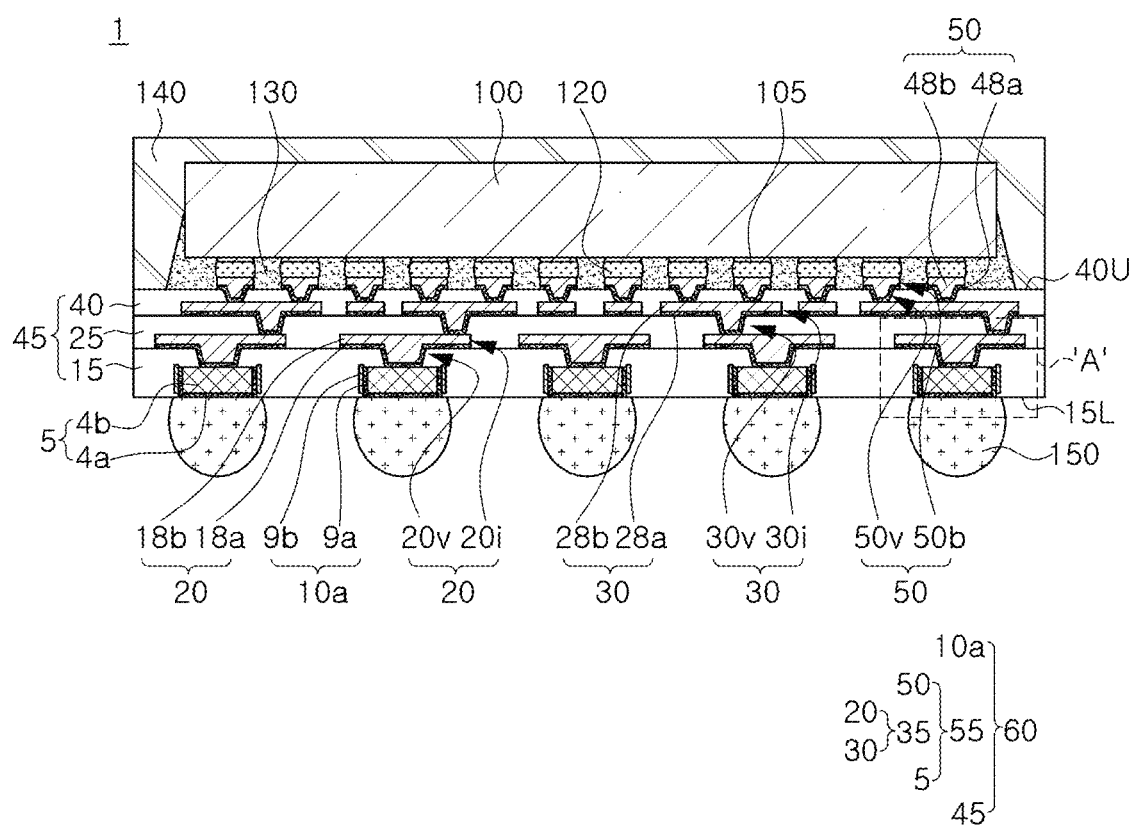
FIG. 1 is a cross-sectional view illustrating a semiconductor package according to some example embodiments.

Hereinafter, some example embodiments will be described with reference to the accompanying drawings, wherein like reference numerals refer to like elements throughout.

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially,"

it will be understood that these values and shapes should be construed as including a manufacturing or operational tolerance (e.g., ±10%) around the stated numerical values or shapes.

Although terms such as "first," "second," and "third" may be used herein to describe various members, components, regions, layers, or sections, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, the term "level" may be a term used to compare relative positions when viewed with reference to the accompanying drawings of cross-sectional structures. Therefore, in the following, even if there is no separate explanation or definition for the term "level," it can be understood based on the accompanying drawings of the cross-sectional structure.

First, a semiconductor package 1 according to some example embodiments will be described with reference to FIGS. 1 and 2. FIG. 1 is a cross-sectional view illustrating a semiconductor package according to some example embodiments, and FIG. 2 is a partially enlarged view illustrating an illustrative example of a portion indicated by 'A' in FIG. 1.

Figure 2:
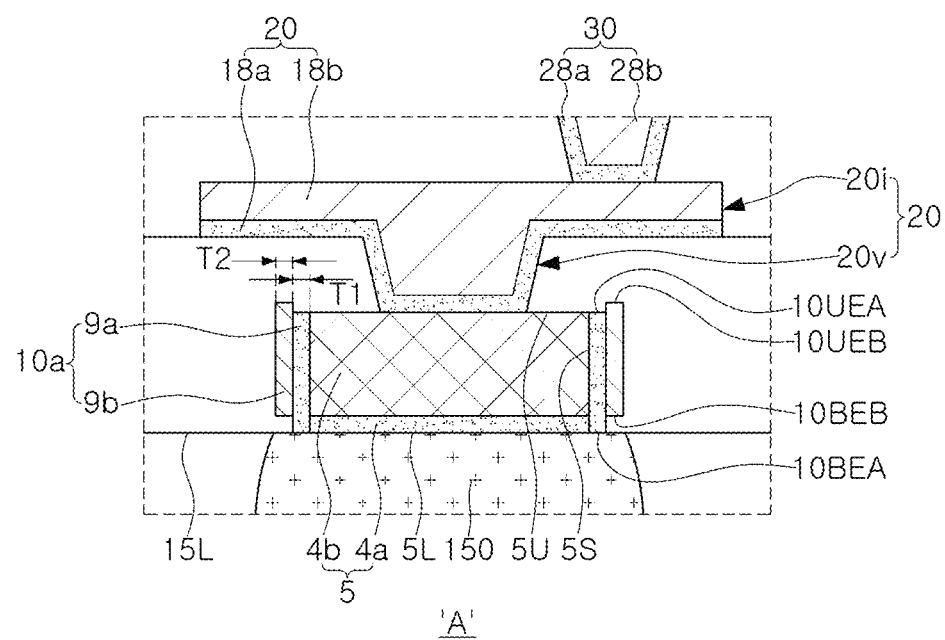
FIG. 2 is a partially enlarged view illustrating an example of a portion indicated by 'A' in FIG. 1.

Referring to FIGS. 1 and 2, a semiconductor package 1 according to some example embodiments may include a redistribution substrate 60 and a semiconductor chip 100 on the redistribution substrate 60.

The redistribution substrate 60 may include a conductive structure 55, a protective layer 10a, and an insulating structure 45. The semiconductor chip 100 may be provided in singular or plural. For example, the semiconductor package 1 may include a single conductor chip 100 on the redistribution substrate 60 (e.g., as illustrated in FIG. 1) and/or may include a plurality of stacked semiconductor chips 100 and/or a plurality of semiconductor chips 100 at the same or substantially the same level.

The semiconductor chip 100 may include at least one of a logic chip and a memory chip. For example, the semiconductor chip 100 may include a microprocessor such as a central processor unit (CPU), a graphic processor unit (GPU), an application processor (AP), a logic chip such as a field programmable gate array (FPGA), an application-specific integrated circuit (ASIC), and/or the like, and/or a memory chip. The memory chip may be a volatile memory chip or a non-volatile memory chip. For example, the volatile memory chip may include dynamic random access memory (DRAM), static RAM (SRAM), thyristor RAM (TRAM), zero capacitor RAM (ZRAM), or twin transistor RAM (TTRAM). In addition, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano-floating gate memory, a holographic memory, a molecular electronics memory, an insulator resistance change memory, and/or the like.

The insulating structure 45 may include a first insulating layer 15, a second insulating layer 25 on the first insulating layer 15, and a third insulating layer 40 on the second insulating layer 25. Although the insulating structure 45 illustrates three insulating layers 15, 25 and 40, the example embodiments are not limited thereto, and the insulating structure 45 may be comprised of, e.g., two, four, and/or more insulating layers.

The insulating structure 45 may include a polymer material. For example, at least one of the first to third insulating layers 15, 25, and 40 may be formed of a polymer material. For example, at least one of the first to third insulating layers 15, 25, and 40 may include a photoimageable dielectric (PID). For example, the PID may include a photoimageable polyimide material and/or a photoimageable ploybenzoxazole (PBO).

The conductive structure 55 may include a lower conductive pattern 5 and a redistribution structure 35 disposed on the lower conductive pattern 5. The conductive structure 55 may further include an upper conductive pattern 50 on the redistribution structure 35. The lower conductive pattern 5 may be provided in plural. The upper conductive pattern 50 may be provided in plural.

The lower conductive pattern 5 may include a lower surface 5L, an upper surface 5U, and a side surface 5S. The first insulating layer 15 may surround the side surface 5S of the lower conductive pattern 5 and may cover at least a portion of the upper surface 5U of the lower conductive pattern 5. A lower surface of the insulating structure 45, for example, a lower surface 15L of the first insulating layer 15 may be disposed on the same or substantially the same level as the lower surface 5L of the lower conductive pattern 5. For example, the lower surface 15L of the first insulating layer 15 may be coplanar with the lower surface 5L of the lower conductive pattern 5.

The lower conductive pattern 5 may be formed of a seed metal layer 4a and a metal material pattern 4b, sequentially stacked. For example, the metal material pattern 4b may have been grown on the seed metal layer 4a. The seed metal layer 4a and the metal material pattern 4b may each include a conductive material. At least one of the conductive material of the seed metal layer 4a and/or the metal material pattern 4b may be selected such that the metal material pattern 4b does not delaminate from the seed metal layer 4a due to lattice mismatch between the conductive materials and/or such that the free energy of nucleation (and/or crystal growth) is greater than a neighboring material. In some example embodiments, for example, the seed metal layer 4a may include a Ti material, a Ti/Cu material, and/or a Ti/W/Cu material; and/or the metal material pattern 4b may include a Cu material.

A thickness of the seed metal layer 4a may be different from a thickness of the metal material pattern 4b. For example, the thickness of the seed metal layer 4a may be less than a thickness of the metal material pattern 4b. The thickness of the seed metal layer 4a may be the same or substantially the same as the thickness of the first protective layer 9a to be described later.

The protective layer 10a may be disposed between the side surface 5S of the lower conductive pattern 5 and the insulating structure 45. The protective layer 10a may be disposed to cover only the side surface 5S of the lower conductive pattern 5 and not to cover the upper surface 5U of the lower conductive pattern 5. The protective layer 10a may serve as an adhesive for bonding the lower conductive pattern 5 and the insulating structure 45. Accordingly, the protective layer 10a may be referred to as an 'adhesive layer'.

The protective layer 10a may serve to protect the lower conductive pattern 5 by preventing the lower conductive pattern 5 from being peeled off. Accordingly, since the protective layer 10a may prevent a defect from occurring when the lower conductive pattern 5 is peeled off, the reliability of the semiconductor package 1 may be improved.

The protective layer 10a may be formed of a multilayer structure. For example, the protective layer 10a may have a structure in which a first protective layer 9a and a second protective layer 9b are sequentially stacked on the side surface 5S of the lower conductive pattern 5.

The first protective layer 9a may be in direct contact with the side surface 5S of the lower conductive pattern 5 and may be disposed to surround the side surface 5S of the lower conductive pattern 5. The first protective layer 9a may be used as a seed metal layer for forming the second protective layer 9b. The first protective layer 9a may be formed of a conductive material. For example, the first protective layer 9a may include a Ti material, a Ti/W material, or a Ti/W/Cu material. The material of the first protective layer 9a is not limited to the above-mentioned type and may be substituted with other materials having conductivity. In some embodiments, the first protective layer 9a may be formed of the same or substantially the same material as the seed metal layer 4a.

A lower end 10BEA of the first protective layer 9a may be disposed on the same or substantially the same level as the lower surface 5L of the lower conductive pattern 5. The lower end 10BEA of the first protective layer 9a may contact the seed metal layer 4a of the lower conductive pattern 5.

An upper end 10UEA of the first protective layer 9a may be disposed on the same or substantially the same level as the upper surface 5U of the lower conductive pattern 5. The upper end 10UEA of the first protective layer 9a may contact the metal material pattern 4b of the lower conductive pattern 5.

The first protective layer 9a may be formed to have a substantially uniform thickness T1. For example, the thickness T1 of the first protective layer 9a may be in a range of about 10 Å to about 100 Å.

The second protective layer 9b may be in direct contact with a portion of the side surface of the first protective layer 9a and may be disposed to surround the side surface of the first protective layer 9a. A portion of the second protective layer 9b may be in contact with the side surface of the first protective layer 9a, and a remainder thereof may not be in contact with the first protective layer 9a. For example, the remainder portion of the second protective layer 9b may extend beyond the upper end 10UEA of the first protective layer 9a and/or the upper surface 5U of the lower conductive pattern 5.

The second protective layer 9b may be used as a blocking layer preventing and/or mitigating the oxidation of the lower conductive pattern 5, e.g., by an oxide material penetrating into the lower conductive pattern 5. The second protective layer 9b may be formed of an insulating material. For example, the second protective layer 9b may include at least one of $SiO_2$ and SiN. The material of the second protective layer 9b is not limited to the above-described type material, and other materials having insulating properties may also be used.

A lower end 10BEB of the second protective layer 9b may be disposed on a higher level than the lower surface of the insulating structure 45, for example, the lower surface 15L of the first insulating layer 15.

An upper end 10UEB of the second protective layer 9b may be disposed on a higher level than the upper end 10UEA of the first protective layer 9a.

The second protective layer 9b may be formed to have a substantially uniform thickness T2. The thickness T2 of the second protective layer 9b may be greater than a thickness T1 of the first protective layer 9a. The thickness T2 of the second protective layer 9b may be in a range of about 100 Å to about 1000 Å. If the thickness T2 of the second protective layer 9b is less than 100 Å, the blocking rate of the oxide material penetrating through the second protective layer 9b may be relatively lowered, and thus, the effect of preventing oxidation of the lower conductive pattern 5 may be reduced.

The redistribution structure 35 may include a plurality of redistribution patterns 20 and 30 disposed at different height levels. For example, the plurality of redistribution patterns 20 and 30 may include a lower redistribution pattern 20 and an upper redistribution pattern 30. Although FIG. 1 illustrates that the plurality of redistribution patterns 20 and 30 comprises two redistribution patterns disposed at different levels, the example embodiments are not limited thereto. For example, the plurality of redistribution patterns may include three (and/or more) redistribution patterns. For example, one or a plurality of redistribution patterns having a structure similar to that of the upper redistribution pattern may be disposed between the lower redistribution pattern 20 and the upper redistribution pattern 30.

The lower redistribution pattern 20 may include a redistribution via 20v penetrating through the first insulating layer 15, and a redistribution line 20i which extends from the redistribution via 20v and is disposed on the first insulating layer 15. In the lower redistribution pattern 20, the redistribution via 20v may penetrate the first insulating layer 15 and may contact the upper surface 5U of the lower conductive pattern 5. The redistribution via 20v may have a width less than a width of the conductive pattern 5.

The lower redistribution pattern 20 may be formed of a seed metal layer 18a and a metal material pattern 18b that are sequentially stacked. The lower redistribution pattern 20 may include conductive materials. In some example embodiments, the conductive materials of the lower redistribution pattern 20 may include substantially similar materials to the lower conductive pattern 5. For example, the seed metal layer 18a may include a Ti material, a Ti/Cu material, and/or a Ti/W/Cu material, and/or the metal material pattern 18b may include a Cu material.

The upper redistribution pattern 30 may include a redistribution via 30v penetrating through the second insulating layer 25 and electrically connected to the lower redistribution pattern 20, and a redistribution line 30i extending from the redistribution via 30v and disposed on the second insulating layer 25. In the upper redistribution pattern 30, the redistribution via 30v may penetrate the second insulating layer 25 and may contact the lower redistribution pattern 20. The upper redistribution patter 30 may include conductive materials. In some example embodiments, the conductive materials of the upper redistribution pattern 30 may include substantially similar materials to the lower conductive pattern 5 and/or the lower redistribution pattern 20. For example, the upper redistribution pattern 30 may be formed of a seed metal layer 28a and a metal material pattern 28b that are sequentially stacked. The seed metal layer 28a may include a Ti material, a Ti/Cu material and/or a Ti/W/Cu material; and/or the metal material pattern 28b may include a Cu material. The third insulating layer 40 may cover an upper surface and a side surface of the upper redistribution pattern 30.

The upper conductive pattern 50 may include a pad portion 50b disposed on a level higher than the upper surface of the insulating structure 45, for example, the upper surface 40U of the third insulating layer 40, and a via portion 50v extending downwardly from at least a portion of the pad portion 50*b* and electrically connected to the redistribution structure 35. The insulating structure 45 may cover a side surface of the via portion 50*v*.

In the upper conductive pattern 50, the via portion 50*v* may penetrate through the third insulating layer 40 and may be electrically connected to the upper redistribution pattern 30. The pad portion 50*b* may also be referred to as a bump part and/or a bump pad.

The upper conductive pattern 50 may include conductive materials. In some example embodiments, the conductive materials of the lower redistribution pattern 20 may include substantially similar materials to, e.g., the lower conductive pattern 5. For example, the upper conductive pattern 50 may be formed of a seed metal layer 48*a* and a metal material pattern 48*b*, sequentially stacked. The seed metal layer 48*a* may include a Ti material, a Ti/Cu material, and/or a Ti/W/Cu material. The metal material pattern 48*b* may include a Cu material, a Ni material, an Au material, or a mixed material including at least two thereof.

The semiconductor package 1 may further include a lower connection pattern 150 below the redistribution substrate 60, and an upper connection pattern 120 between the redistribution substrate 60 and the semiconductor chip 100.

The lower connection pattern 150 may be electrically connected to the lower conductive pattern 5 of the redistribution substrate 60. The upper connection pattern 120 may be electrically connected to the upper conductive pattern 50 of the redistribution substrate 60 and the pad 105 of the semiconductor chip 100. The pad 105 of the semiconductor chip 100 may be referred to as a bump. The upper connection pattern 120 may contact the upper conductive pattern 50 of the redistribution substrate 60 and may contact the pad 105 of the semiconductor chip 100.

The upper connection pattern 120 may have a land, ball, or pin shape. The upper connection pattern 120 may be formed of a eutectic alloy and/or low-melting-point metal. For example, the upper connection pattern 120 may include a solder material, for example, an alloy including tin (Sn), include (e.g., Sn—Ag—Cu) and/or the like.

The lower connection pattern 150 may include a eutectic alloy and/or low-melting-point metal, for example, a solder material (e.g., tin (Sn) and/or an alloy (Sn—Ag—Cu) containing tin (Sn). The lower connection pattern 150 may be a land, a ball, and/or a pin. The lower connection pattern 150 may also include a copper pillar and/or a solder ball.

The semiconductor package 1 may further include an underfill resin 130 disposed between the redistribution substrate 60 and the plurality of semiconductor chips 100 and surrounding the side surface of the upper connection pattern 150. The underfill resin 130 may include an insulating resin such as an epoxy resin.

The semiconductor package 1 may further include an encapsulant 140 surrounding at least a side surface of the semiconductor chip 100, on the redistribution substrate 60. The encapsulant 140 may surround a side surface of the semiconductor chip 100 and cover an upper surface of the semiconductor chip 100.

The encapsulant 140 may include an insulating material, for example, a resin such as epoxy molding compound (EMC) and/or Ajinomoto build-up film (ABF).

In some example embodiments, the underfill resin 130 may be formed in a molded under-fill (MUF) method to form a portion of the encapsulant 140. For example, the underfill resin 130 and the encapsulant 140 may be the same or different materials.

In the above-described embodiments, the redistribution substrate 60 may have a first surface 40U and a second surface 15L opposing each other, and the semiconductor chip 100 may be disposed on the first surface 40U of the redistribution substrate 60, and the lower connection pattern 150 may be disposed below the second surface 15L of the redistribution substrate 60. For example, the second surface 15L may be configured to be bonded to, e.g., an external device.

Next, modified examples of some components of the semiconductor package 1 described above will be described. Hereinafter, the components that may be modified or replaced among the components of the semiconductor package 1 will be mainly described, and descriptions of the remaining components will be omitted or described together with components that may be modified by directly citing the description.

Figure 3:
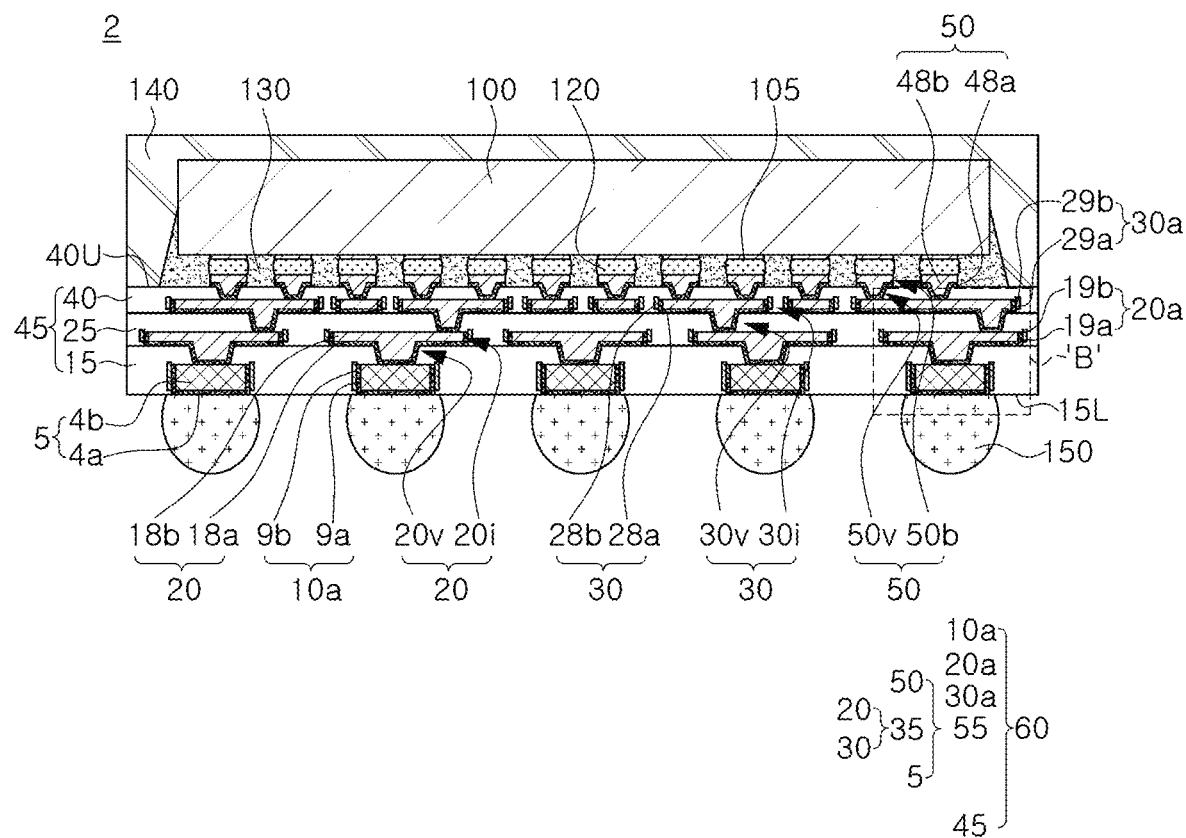
FIG. 3 is a cross-sectional view illustrating a modified example of a semiconductor package according to some example embodiments.

A semiconductor package 2 according to a modified example will be described with reference to FIGS. 3 and 4. FIG. 3 is a cross-sectional view illustrating a modified example of a semiconductor package according to some example embodiments, and FIG. 4 is a partially enlarged view illustrating an illustrative example of a portion indicated by 'B' in FIG. 3.

In the semiconductor package 2 of the modified example protective layers 10*a*, 20*a*, and 30*a* are formed on the side surface 5S of the lower conductive pattern 5 and side surfaces of the redistribution structure 35, respectively. In the modified example in FIG. 3, a case in which the protective layers 10*a*, 20*a*, and 30*a* are formed on all the side surface 5S of the lower conductive pattern 5 and the side surfaces of the redistribution structure 35 is described as an example, but according to some embodiments, the protective layers 20*a* and 30*a* may be formed only on the side surfaces of the redistribution structure 35, and/or the protective layers 20*a* and 30*a* may be formed only on some of the redistribution structures 35. For example, the protective layers 20*a* and 30*a* may be formed on only one of the lower redistribution pattern 20 and the upper redistribution pattern 30. Hereinafter, only the protective layers 20*a* and 30*a* formed on the side surfaces of the redistribution structure 35 will be described. Since the protective layers 20*a* and 30*a* have the same or substantially the same configuration as the aforementioned protective layer 10*a*, a detailed description thereof will be omitted.

Figure 4:
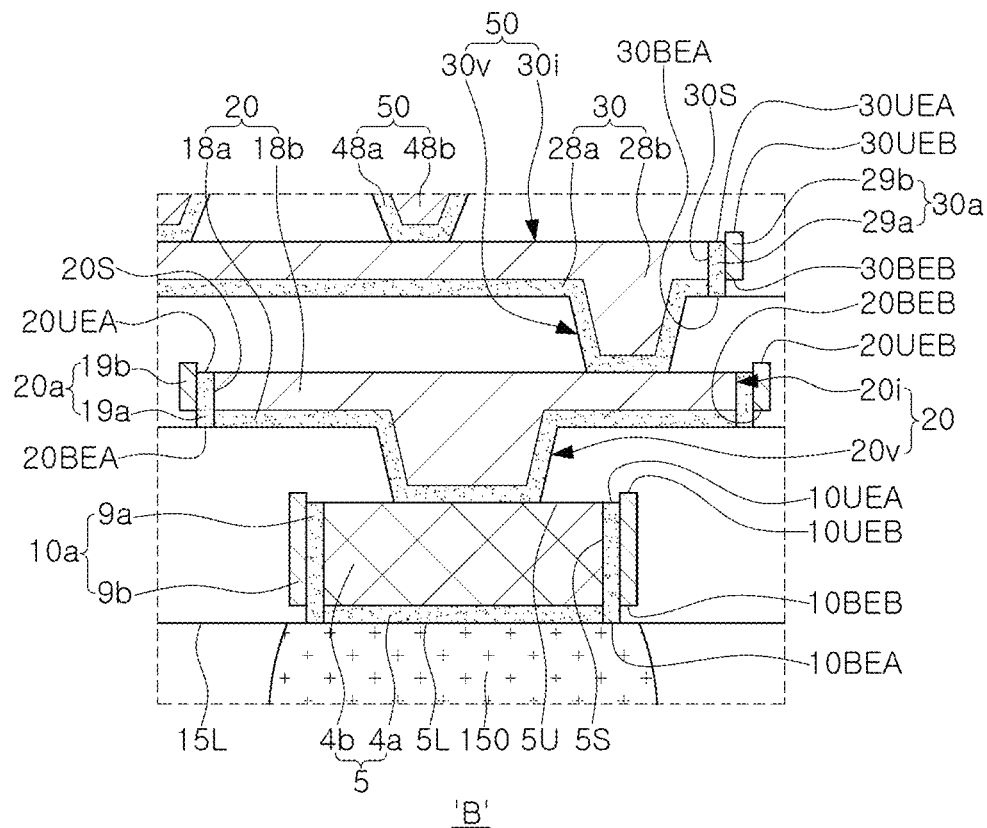
FIG. 4 is a partially enlarged view of an illustrative example of a portion indicated by 'B' in FIG. 3.

Referring to FIGS. 3 and 4, the protective layers 20*a* and 30*a* may be formed on the side surface 20S of the lower redistribution pattern 20 and the side surface 30S of the upper redistribution pattern 30, respectively. The protective layers 20*a* and 30*a* may be formed in the same or substantially the same multi-layered structure as the aforementioned protective layer 10*a*. For example, the protective layer 20*a* may have a structure in which a first protective layer 19*a* and a second protective layer 19*b* are sequentially stacked on the side surface 20S of the lower redistribution pattern 20. The protective layer 30*a* may have a structure in which a first protective layer 29*a* and a second protective layer 29*b* are sequentially stacked on the side surface 30S of the upper redistribution pattern 30.

Lower ends 20BEA and 30BEA of the first protective layers 19*a* and 29*a* may be disposed on the same or substantially the same level as lower surfaces of the lower redistribution pattern 20 and the redistribution lines 20*i* and 30*i*, respectively. The lower ends 20BEA and 30BEA of the first protective layers 19*a* and 29*a* may contact the seed metal layers 28*a* and 29*a* of the lower redistribution pattern 20 and the upper redistribution pattern 30, respectively.

The upper ends 20UEA and 30UEA of the first protective layers 19*a* and 29*a* may be disposed on the same or substantially the same level as the upper surfaces of the redistribution lines 20*i* and 30*i*, respectively. The upper ends 20UEA and 30UEA of the first protective layers 19*a* and 29*a* may contact the metal material patterns 18*b* and 28*b* of the lower conductive pattern 5, respectively.

The lower ends 20BEB and 30BEB of the second protective layers 19*b* and 29*b* may be disposed on a higher level than the lower surface of the insulating structure 45, for example, the lower surfaces of the second and third insulating layers 25 and 40, respectively.

The lower ends 20BEB and 30BEB of the second protective layers 19*b* and 29*b* may be disposed on a higher level than the upper ends 20UEA and 30UEA of the first protective layers 19*a* and 29*a*, respectively.

The protective layers 20*a* and 30*a* may serve to prevent the lower redistribution pattern 20 and the upper redistribution pattern 30 from peeling off, and to protect the lower redistribution pattern 20 and the upper redistribution pattern 30. Accordingly, since the protective layers 20*a* and 30*a* may prevent defects occurring when, e.g., the lower redistribution pattern 20 and the upper redistribution pattern 30 are peeled off, the reliability of the semiconductor package 2 may be improved.

Next, an illustrative example of a method of manufacturing a semiconductor package according to some example embodiments will be described with reference to FIGS. 5 to 15.

Figure 5:
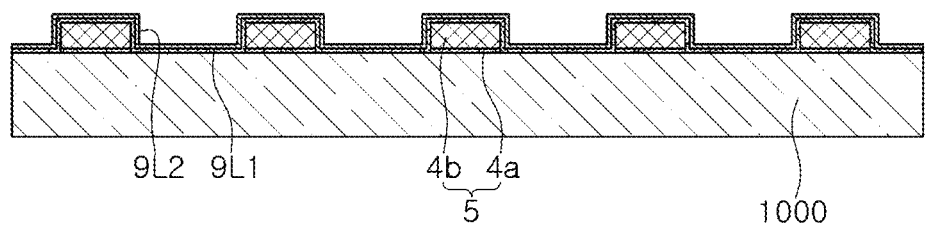
FIGS. 5 to 15 are cross-sectional views illustrating a method of manufacturing a semiconductor package according to some example embodiments.

Referring to FIG. 5, a lower conductive pattern 5 may be formed on a carrier 1000. The lower conductive pattern 5 may be formed to have the same or substantially the same shape as the lower conductive pattern 5 described with reference to FIGS. 1 and 2. A plurality of the lower conductive patterns 5 may be formed in plural. The lower conductive pattern 5 may be formed of a seed metal layer 4*a* and a metal material pattern 4*b* that are sequentially stacked.

A conductive material layer 9L1 and an insulating material layer 9L2 may be sequentially stacked to cover the lower conductive pattern 5. The conductive material layer 9L1 is used to form the first protective layer 9*a* in a subsequent process, and the insulating material layer 9L2 is used to form the second protective layer 9*b* in a subsequent process. The conductive material layer 9L1 and the insulating material layer 9L2 may be formed of the same or substantially the same material as the first and second protective layers 9*a* and 9*b* described with reference to FIGS. 1 and 2.

The conductive material layer 9L1 may be formed by, e.g., a plasma vapor deposition (PVD) process, and the insulating material layer 9L2 may be formed by, e.g., a chemical vapor deposition (CVD) process, but the example embodiments are not limited thereto.

In an example, in the case of the conductive material layer 9L1 and the insulating material layer 9L2, a thickness of a portion thereof (e.g., covering the upper surface of the lower conductive pattern 5 and the surface of the carrier 1000 that does not overlap the lower conductive pattern 5) may be greater than a thickness of a portion covering the side surface of the lower conductive pattern 5.

In another example, the conductive material layer 9L1 and the insulating material layer 9L2 may each have a substantially uniform thickness.

Figure 6:
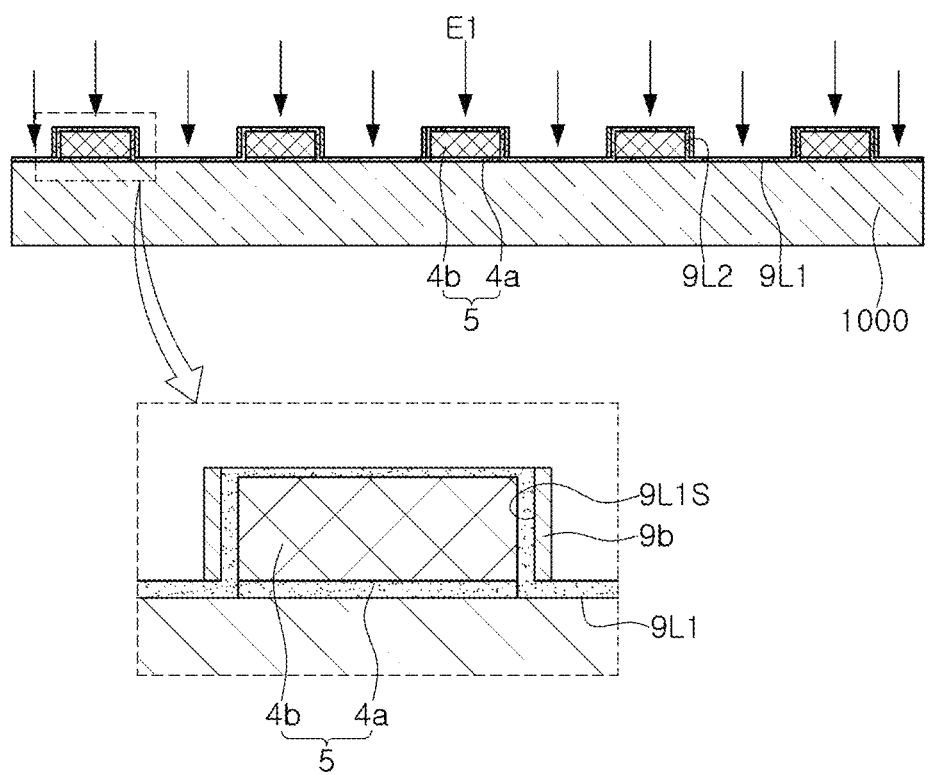

Referring to FIG. 6, the insulating material layer 9L2 is dry etched (E1) to remove the remaining regions of the insulating material layer 9L2 except for the region covering the side surface 9L1S of the conductive material layer 9L1. When dry etching is performed, the insulating material layer 9L2 is anisotropically etched in a direction perpendicular to the carrier 1000, and a region of the insulating material layer 9L2 covering only the side surface 9L1S of the conductive material layer 9L1 may remain, and the remaining regions thereof may be removed.

Accordingly, the upper surface of the lower conductive pattern 5, and the conductive material layer 9L1 stacked on the upper surface of the carrier 1000, may be exposed. Therefore, the second protective layer 9*b* may be formed. Since the insulating material layer 9L2 is dry etched while the conductive material layer 9L1 covers the lower conductive pattern 5, the lower conductive pattern 5 is exposed during the dry etching process, and thus, the chamber in which the dry etching process is performed may be prevented from being contaminated with the material of the lower conductive pattern 5.

Figure 7:
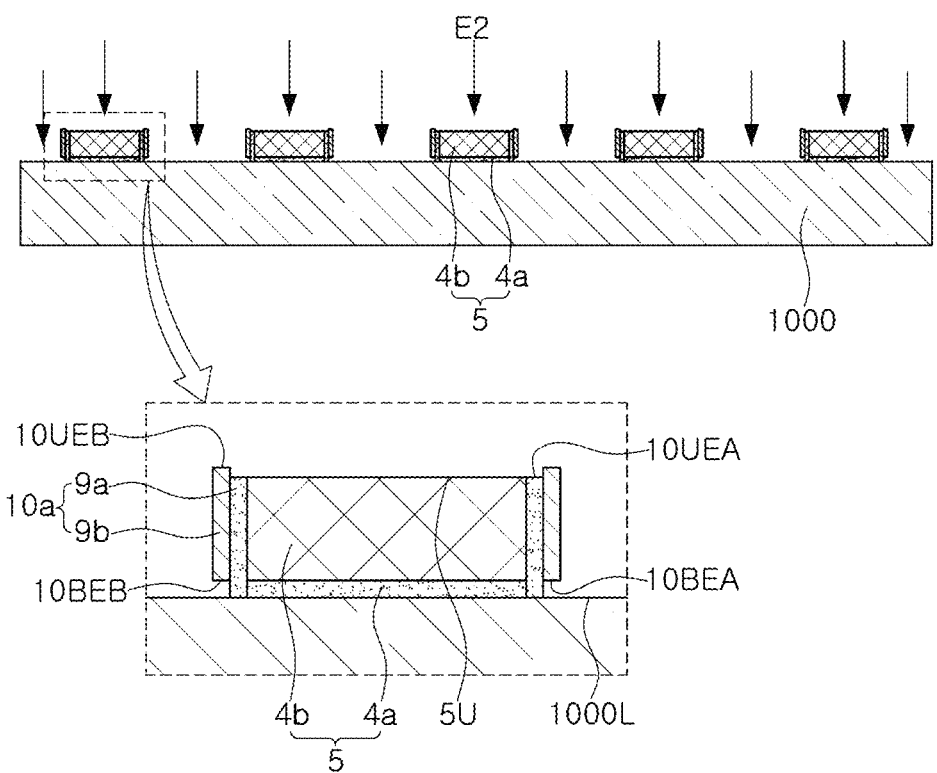

Referring to FIG. 7, the conductive material layer 9L1 may be wet-etched (E2) to remove the remaining regions except for the region covering the side surface of the lower conductive pattern 5. The wet etching may be performed using a material having a relatively high etch selectivity with respect to the conductive material layer 9L1. Accordingly, the conductive material layer 9L1 may be etched to remove the remaining regions while the etching of the second protective layer 9*b* formed in the previous process is significantly reduced. When wet etching is performed, the conductive material layer 9L1 is isotropically etched, and thus, a region of the conductive material layer 9L1 in contact with the upper surface 5U of the lower conductive pattern 5 and a region thereof in contact with the carrier 1000 may both be removed. Accordingly, only the region covered by the second protective layer 9*b* remains, and the first protective layer 9*a* spaced apart from an upper surface 1000L of the carrier 1000 may be formed. Though illustrated as being completely etched away from under the lower end 10BEA of the second protective layer 9*b*, a portion of and/or residue from the conductive material layer 9L1 may remain and/or the side surface of the first protective layer 9*a* exposed by the second protective layer 9*b* may be partially etched.

Figure 8:
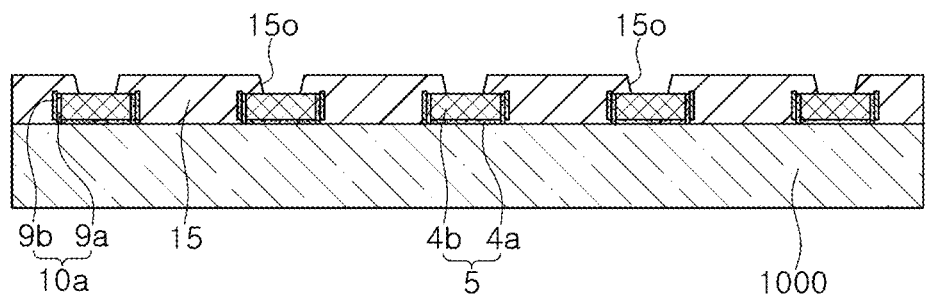

Referring to FIG. 8, a first insulating layer 15 is formed on the protective layer 10, and an opening 15*o* penetrating through the first insulating layer 15 and exposing a portion of the lower conductive pattern 5 may be formed. The first insulating layer 15 may be the same or substantially the same as the first insulating layer 15 described with reference to FIG. 1.

Figure 9:
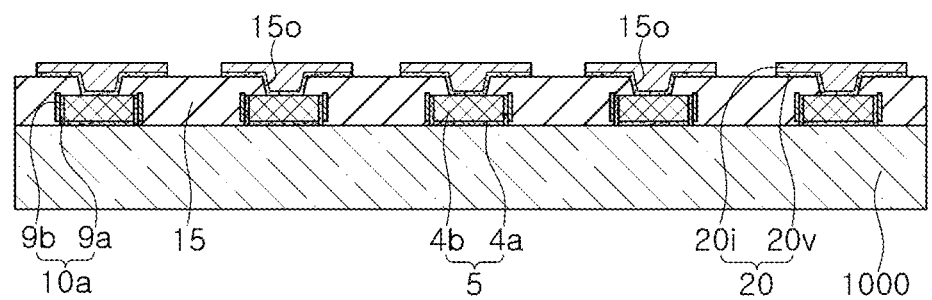

Referring to FIG. 9, a lower redistribution pattern 20 may be formed to include a redistribution via 20*v* in contact with the lower conductive pattern 5 while filling the opening 15*o*, and a redistribution line 20*i* extending from the redistribution via 20*v* and disposed on the first insulating layer 15. The lower redistribution pattern 20 may be formed using, e.g., a plating process. For example, forming the lower redistribution pattern 20 may include forming a seed metal layer 18*a*, forming a metal material pattern 18*b* on the seed metal layer 18*a* in a plating process, and patterning the seed metal layer 18*a* and the metal material pattern 18*b*. For example, in some embodiments, the conductive material of the seed metal layer 18*a* may be selected such that the free energy for forming the metal material pattern 18*b* on the seed metal layer 18*a* is less than the free energy for forming the conductive material of the metal material pattern 18*b* on the first insulating layer 15.

Figure 10:
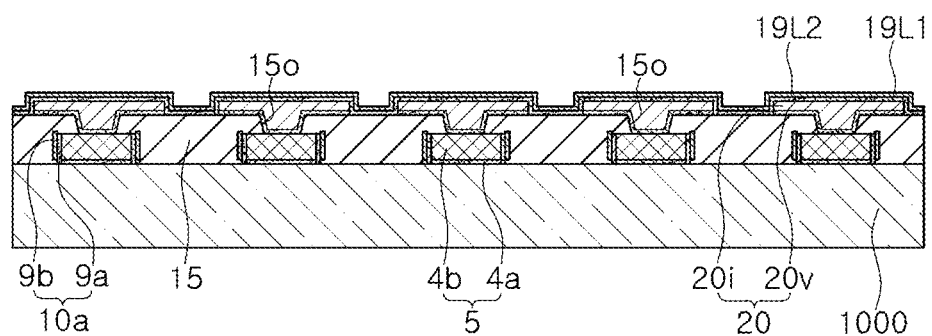

Referring to FIG. 10, a conductive material layer 19L1 and an insulating material layer 19L2 may be sequentially stacked to cover the lower redistribution pattern 20 in the same or substantially the same process as that of FIG. 5. The conductive material layer 19L1 and the insulating material layer 19L2 may be formed of the same or substantially the same material as the conductive material layer 9L1 and the insulating material layer 9L2 described with reference to FIG. 5 and formed to have the same or substantially the same shape thereas.

Figure 11:
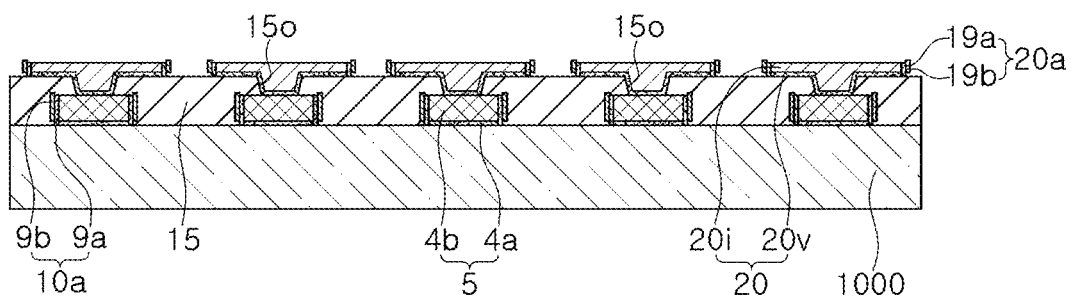

Referring to FIG. 11, a dry etching process the same or substantially the same as that performed in FIG. 6 and a wet etching process the same or substantially the same as that performed in FIG. 7 may be performed, to form a protective layer 20a including the first protective layer 19a and the second protective layer 19b on the side surface of the lower redistribution pattern 20.

Figure 12:
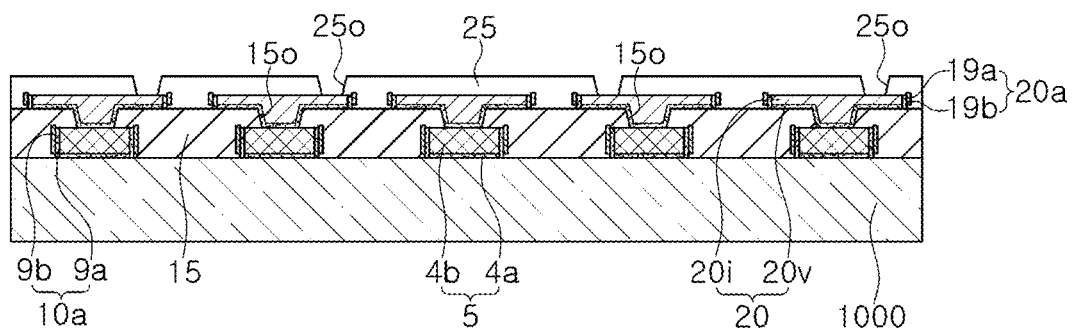

Referring to FIG. 12, a second insulating layer 25 covering the lower redistribution pattern 20 may be formed on the first insulating layer 15, and an opening 25o exposing a portion of the lower redistribution pattern 20 while penetrating through the second insulating layer 25 may be formed. The second insulating layer 25 may be the same or substantially the same as the first insulating layer 15 described with reference to FIG. 1.

Figure 13:
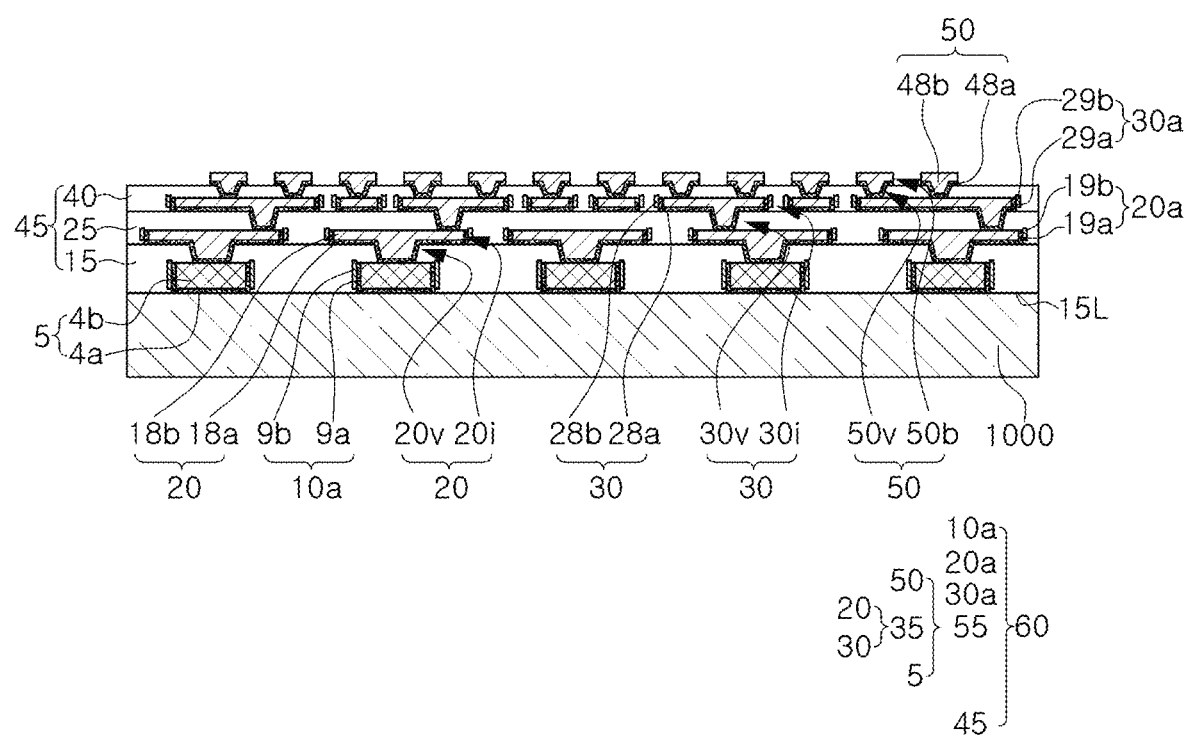

Referring to FIG. 13, the upper redistribution pattern 30 including a redistribution via 30v contacting the lower redistribution pattern 20 while filling the opening 25o and a redistribution line 30i extending from the redistribution via 30v and formed on the second insulating layer 25 may be formed. The upper redistribution pattern 30 may be formed in the same or substantially the same process as the lower redistribution pattern 20. The upper redistribution pattern 30 may include a seed metal layer 28a and a metal material pattern 28b sequentially stacked. Accordingly, a redistribution structure 35 including the lower redistribution pattern 20 and the upper redistribution pattern 30 as described with reference to FIG. 1 may be formed.

A protective layer 30a including a first protective layer 29a and a second protective layer 29b may be formed on a side surface of the upper redistribution pattern 30. The protective layer 30a may be formed using the same or substantially the same process as that of the protective layer 20a of the upper redistribution pattern 30.

A third insulating layer 40 covering the upper redistribution pattern 30 may be formed on the second insulating layer 25. Accordingly, an insulating structure 45 including the first to third insulating layers 15, 25, and 40 as described with reference to FIG. 1 may be formed.

An upper conductive pattern 50 may be formed to include a via portion 50v penetrating through the third insulating layer 40 and contacting the upper redistribution pattern 30 and a pad portion 50b extending from the via portion 50v and formed on the third insulating layer 40. The upper conductive pattern 50 may be formed of a seed metal layer 48a and a metal material pattern 48b that are sequentially stacked. Accordingly, a conductive structure 55 including the lower conductive pattern 5, the redistribution structure 35, and the upper conductive pattern 50 as described with reference to FIG. 1 may be formed.

Figure 14:
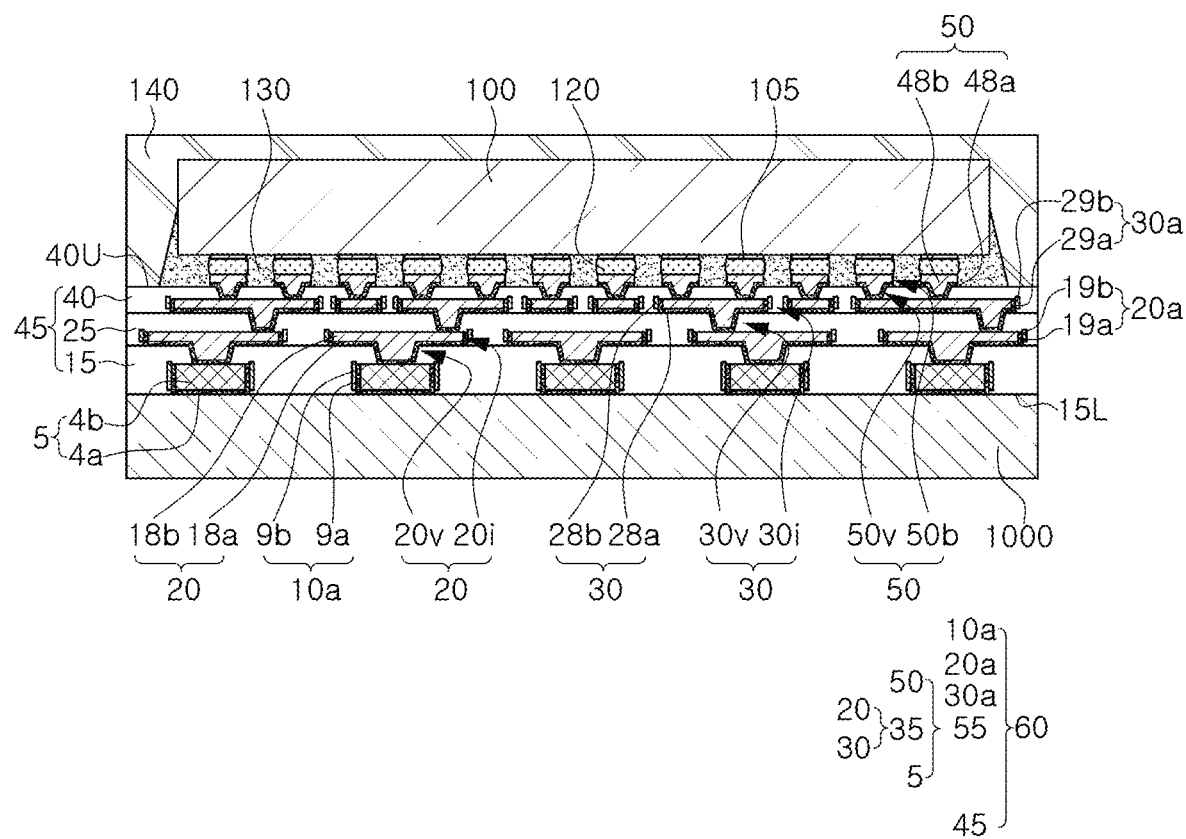

Referring to FIG. 14, a semiconductor chip 100 may be prepared. The semiconductor chip 100 may be the semiconductor chip 100 as illustrated in FIG. 1.

The semiconductor chip 100 may be mounted on a structure including the insulating structure 45 and the conductive structure 55. For example, the semiconductor chip 100 may include a pad 105, and the upper conductive pattern 50 and the pad 105 of the semiconductor chip 100 may be connected using an upper connection pattern 120. The upper connection pattern 120 may include a solder material. For example, the upper connection pattern 120 may be formed to be bonded to the pad 105 and the upper conductive pattern 50 of the semiconductor chip 100, using a solder reflow process. An underfill resin 130 surrounding the side surface of the upper connection pattern 120 may be formed between the insulating structure 45 and the semiconductor chip 100 and/or an encapsulant 140 covering at least a side surface of the semiconductor chip 100 may be formed on the insulating structure 45.

Figure 15:
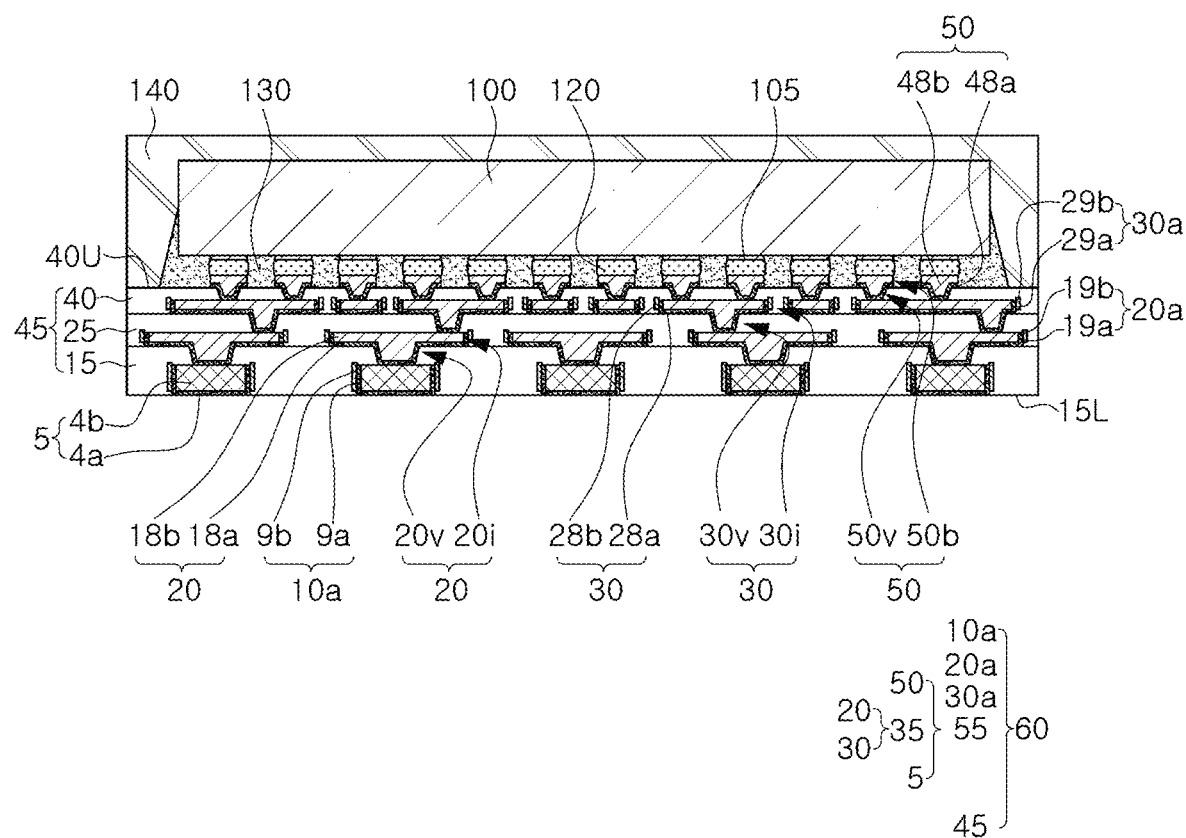

Referring to FIG. 15, the carrier (refer to 1000 in FIG. 15) is removed to expose the lower end of the first protective layer 9a in contact with the lower surface of the first insulating layer 15 and to expose the seed metal layer 4a of the lower conductive pattern 5.

Again, referring to FIG. 1, a lower connection pattern 150 in contact with the lower surface of the lower conductive pattern 5 and the lower end of the protective layer 10a may be formed. The lower connection pattern 150 may be formed of a solder ball.

As set forth above, according to some example embodiments, a redistribution substrate may include a lower conductive pattern, a redistribution structure on the lower conductive pattern, an insulating structure covering the lower conductive pattern and side surfaces of the redistribution structure, and a protective layer between the lower conductive pattern and the insulating structure. The protective layer may serve to protect the lower conductive pattern by preventing the lower conductive pattern from being peeled off. Accordingly, since the protective layer may prevent defects from occurring while the lower conductive pattern is peeled off, the reliability of the semiconductor package may be improved.

While some example embodiments have been illustrated and described above, it will be apparent to those skilled in the art that modifications and variations could be made without departing from the scope of the present inventive concepts as defined by the appended claims.

What is claimed is:
1. A semiconductor package comprising:
a semiconductor chip; and
a redistribution substrate connected to the semiconductor chip, the redistribution substrate including
a conductive structure including a lower conductive pattern, and a redistribution between the lower conductive pattern and the semiconductor chip and electrically connected to the lower conductive pattern,
an insulating structure covering at least one of a side surface of the lower conductive pattern or a side surface of the redistribution structure, and
a protective layer between the insulating structure and at least one of the lower conductive pattern or the redistribution structure, the protective layer including a first protective layer including a conductive material and in contact with the side surface of at least one of the lower conductive pattern or the redistribution structure, and a second protective layer including an insulating material and a surface in contact with at least a portion of a side surface of the first protective layer,
wherein a portion of the surface of the second protective layer in contact with the side surface of the first protective layer extends past an upper end of the side surface of the first protective layer such that a distance between an upper end of the surface of the second protective layer and the semiconductor chip is less than a distance between the upper end of the side surface of the first protective layer and the semiconductor chip.

2. The semiconductor package of claim 1, wherein
the lower conductive pattern includes a seed metal layer and a metal material pattern on the seed metal layer, and
the seed metal layer of the lower conductive pattern is in contact with the first protective layer.

3. The semiconductor package of claim 2, wherein the seed metal layer and the first protective layer include a same material.

4. The semiconductor package of claim 2, wherein
a lower end of the first protective layer is in contact with the seed metal layer of the lower conductive pattern, and
an upper end of the first protective layer is in contact with the metal material pattern.

5. The semiconductor package of claim 1, wherein
a lower end of the first protective layer is on a same level as a lower surface of the insulating structure, and
a lower end of the second protective layer is at a higher level than the lower surface of the insulating structure.

6. The semiconductor package of claim 1, wherein
an upper end of the first protective layer is on a same level as an upper surface of the lower conductive pattern.

7. The semiconductor package of claim 1, wherein
the redistribution structure includes a redistribution line and a redistribution via connecting a portion of the redistribution line to the lower conductive pattern, and
the redistribution via has a width less than a width of the lower conductive pattern.

8. The semiconductor package of claim 7, wherein the protective layer is on a side surface of the redistribution line.

9. The semiconductor package of claim 8, wherein
the redistribution structure includes a seed metal layer and a metal material pattern on the seed metal layer,
wherein the seed metal layer is in contact with the lower conductive pattern.

10. The semiconductor package of claim 9, wherein the first protective layer is in contact with the seed metal layer.

11. The semiconductor package of claim 10, wherein
an upper end of the first protective layer is on a same level as an upper surface of the redistribution line, and
an upper end of the second protective layer is at a higher level than the upper end of the first protective layer.

12. The semiconductor package of claim 1, further comprising:
an upper connection pattern between the semiconductor chip and the redistribution substrate,
wherein the conductive structure further includes an upper conductive pattern electrically connected to the redistribution structure,
the upper conductive pattern includes a pad portion and a via portion, the pad portion at a higher level than an upper surface of the insulating structure, and the via portion connecting at least a portion of the pad portion to the redistribution structure,
the insulating structure covers a side surface of the via portion, and
the upper connection pattern is in contact with the upper conductive pattern.

13. The semiconductor package of claim 12, further comprising:
an encapsulant covering at least a side surface of the semiconductor chip and between the semiconductor chip and the redistribution substrate to surround a side surface of the upper connection pattern.

14. The semiconductor package of claim 12, further comprising:
an underfill resin surrounding a side surface of the upper connection pattern, between the semiconductor chip and the redistribution substrate; and
an encapsulant covering at least a side surface of the semiconductor chip, on the redistribution substrate.

15. A semiconductor package comprising:
a redistribution substrate including a conductive structure and an insulating structure covering at least a side surface of the conductive structure;
a semiconductor chip on a first surface of the redistribution substrate; and
an upper connection pattern between the redistribution substrate and the semiconductor chip, the upper connection pattern electrically connecting the redistribution substrate and the semiconductor chip,
wherein the conductive structure includes a lower conductive pattern electrically connected to a lower connection pattern and a redistribution structure including a plurality of redistribution patterns on different levels, the plurality of redistribution patterns between the upper connection pattern and the lower conductive pattern,
the redistribution substrate further includes a protective layer between the insulating structure and at least one of the lower conductive pattern or the redistribution structure,
a lower redistribution pattern, among the plurality of redistribution patterns, includes a redistribution line and a via connecting a portion of the redistribution line with the lower conductive pattern,
the protective layer includes a first protective layer including a conductive material and in contact with a side surface of at least one of the lower conductive pattern or the redistribution line, and a second protective layer including an insulating material and a surface in contact with at least a portion of a side surface of the first protective layer, and
a portion of the surface of the second protective layer in contact with the side surface of the first protective layer extends past an upper end of the side surface of the first protective layer such that a distance between an upper end of the surface of the second protective layer and the semiconductor chip is less than a distance between the upper end of the side surface of the first protective layer and the semiconductor chip.

16. The semiconductor package of claim 15, wherein
the conductive structure further includes an upper conductive pattern on an upper redistribution pattern, among the plurality of redistribution patterns, and electrically connected to the upper redistribution pattern,
the upper connection pattern is in contact with the upper conductive pattern,
the lower connection pattern is in contact with a lower end of the protective layer and a lower surface of the lower conductive pattern,
the first protective layer includes a conductive material, and
the second protective layer includes an insulating material.

17. The semiconductor package of claim 16, wherein
the conductive material includes Ti, and
the insulating material includes at least one of $SiO_2$ and SiN.

18. A semiconductor package comprising:

a redistribution substrate including a conductive structure including a lower conductive pattern and a redistribution structure on the lower conductive pattern and electrically connected to the lower conductive pattern, an insulating structure covering at least a side surface of the redistribution structure, and a protective layer between the insulating structure and at least one of the lower conductive pattern or the redistribution structure, the protective layer including a first protective layer including a conductive material and a second protective layer including an insulating material, the first protective layer covering a side surface of at least one of the lower conductive pattern or the redistribution structure, and the second protective layer including a surface covering at least a portion of a side surface of the first protective layer;

a semiconductor chip on the redistribution substrate; and a lower connection pattern below the redistribution substrate and in contact with the lower conductive pattern and the protective layer, wherein a portion of the surface of the second protective layer in contact with the side surface of the first protective layer extends past an upper end of the side surface of the first protective layer such that a distance between an upper end of the surface of the second protective layer and the semiconductor chip is less than a distance between the upper end of the side surface of the first protective layer and the semiconductor chip, a thickness of the first protective layer is in a range of 10 Å to 100 Å, and a thickness of the second protective layer is in a range of 100 Å to 1000 Å.

19. The semiconductor package of claim 18, wherein the first protective layer includes Ti, and the second protective layer includes at least one of $SiO_2$ and SiN.

* * * * *